(12) United States Patent
Vos et al.

(10) Patent No.: US 9,485,560 B2
(45) Date of Patent: Nov. 1, 2016

(54) EMBEDDED CIRCUIT IN A MEMS DEVICE

(71) Applicant: Knowles Electronics, LLC, Itasca, IL (US)

(72) Inventors: Sandra F. Vos, East Dundee, IL (US); Daniel Giesecke, St. Charles, IL (US)

(73) Assignee: Knowles Electronics, LLC, Itasca, IL (US)

(*) Notice: Subject to any disclaimer, the term of this patent is extended or adjusted under 35 U.S.C. 154(b) by 0 days.

(21) Appl. No.: 14/665,745

(22) Filed: Mar. 23, 2015

(65) Prior Publication Data

US 2015/0251898 A1 Sep. 10, 2015

Related U.S. Application Data

(63) Continuation-in-part of application No. 13/755,417, filed on Jan. 31, 2013, now Pat. No. 8,995,694.

(60) Provisional application No. 61/593,611, filed on Feb. 1, 2012, provisional application No. 61/706,350, filed on Sep. 27, 2012.

(51) Int. Cl.
*H04R 25/00* (2006.01)
*H04R 1/04* (2006.01)
(Continued)

(52) U.S. Cl.
CPC ............ *H04R 1/04* (2013.01); *B81C 1/0023* (2013.01); *H04R 19/005* (2013.01);
(Continued)

(58) Field of Classification Search
CPC ...... H04R 19/005; H04R 19/04; H04R 3/00; H04R 3/005; H04R 1/04; H04R 2499/11; H04R 2201/003; H04R 17/02; H04R 5/04; B81B 2201/0257; B81B 7/008; H01L 2224/48227

USPC ....... 381/174, 175, 150, 355, 333, 306, 388, 381/334, 361, 374; 29/594, 609.1; 257/416, 257/704, 723, 724, 731, 774, 782
See application file for complete search history.

(56) References Cited

U.S. PATENT DOCUMENTS 6,781,231 B2 * 8/2004 Minervini ............. B81B 7/0064
257/704
7,190,038 B2 3/2007 Dehe et al.
(Continued)

FOREIGN PATENT DOCUMENTS

| JP | 2012-086345 A | 5/2012 |
|---|---|---|
| KR | 10-2012-0005768 A | 1/2012 |
| WO | 2011076910 A1 | 6/2011 |

OTHER PUBLICATIONS

International Search Report and Written Opinion for PCT/US2013/061873, dated Jan. 28, 2014, 9 pages.
(Continued)

*Primary Examiner* — Sunita Joshi
(74) *Attorney, Agent, or Firm* — Foley & Lardner LLP

(57) ABSTRACT

A Microelectromechanical System (MEMS) microphone includes a base printed circuit board (PCB), the base PCB having customer pads; at least one wall coupled to the base; a lid PCB coupled to the at least wall, the lid having a port extending there through; an electrically conductive through-hole via extending through the wall electrically connecting the lid PCB to the base PCB; an integrated circuit embedded in the lid and coupled to the electrically conductive through-hole via; and a micro electro mechanical system (MEMS) device coupled to the integrated circuit in the lid and disposed over the port. Sound energy is converted to an electrical signal by the MEMS device and transmitted to the integrated circuit. The integrated circuit processes the signals and sends the processed signals to the customer pads via the electrically conductive through-hole via.

20 Claims, 9 Drawing Sheets

(51) Int. Cl.
*B81C 1/00* (2006.01)
*H04R 19/00* (2006.01)
*H04R 31/00* (2006.01)
*H01L 29/84* (2006.01)
*H04R 19/04* (2006.01)

(52) U.S. Cl.
CPC ........... *B81B 2201/0257* (2013.01); *H01L 2224/48091* (2013.01); *H01L 2224/48137* (2013.01); *H01L 2224/73265* (2013.01); *H01L 2924/16151* (2013.01); *H01L 2924/16152* (2013.01); *H04R 19/04* (2013.01); *H04R 31/006* (2013.01)

(56) References Cited

U.S. PATENT DOCUMENTS

| | | | |
|---|---|---|---|
| 7,473,572 B2 | 1/2009 | Dehe et al. | |
| 7,781,249 B2 | 8/2010 | Laming et al. | |
| 7,795,695 B2 | 9/2010 | Weigold et al. | |
| 7,825,484 B2 | 11/2010 | Martin et al. | |
| 7,829,961 B2 | 11/2010 | Hsiao | |
| 7,856,804 B2 | 12/2010 | Laming et al. | |
| 7,903,831 B2 | 3/2011 | Song | |
| 2002/0020898 A1 | 2/2002 | Vu et al. | |
| 2005/0207605 A1 | 9/2005 | Dehe et al. | |
| 2007/0058526 A1* | 3/2007 | Jain | H04L 12/462 370/216 |
| 2007/0058826 A1* | 3/2007 | Sawamoto | H04R 19/04 381/174 |
| 2007/0205492 A1 | 9/2007 | Wang | |
| 2007/0278501 A1 | 12/2007 | MacPherson et al. | |
| 2008/0175425 A1 | 7/2008 | Roberts et al. | |
| 2008/0267431 A1 | 10/2008 | Leidl et al. | |
| 2008/0279407 A1 | 11/2008 | Pahl | |
| 2008/0283942 A1 | 11/2008 | Huang et al. | |
| 2009/0001553 A1* | 1/2009 | Pahl | B81B 7/0064 257/704 |
| 2009/0180655 A1 | 7/2009 | Tien et al. | |
| 2010/0046780 A1 | 2/2010 | Song | |
| 2010/0052082 A1 | 3/2010 | Lee et al. | |
| 2010/0128914 A1 | 5/2010 | Khenkin | |
| 2010/0183181 A1 | 7/2010 | Wang | |
| 2010/0246877 A1 | 9/2010 | Wang et al. | |
| 2010/0290644 A1 | 11/2010 | Wu et al. | |
| 2010/0322443 A1 | 12/2010 | Wu et al. | |
| 2010/0322451 A1 | 12/2010 | Wu et al. | |
| 2011/0013787 A1 | 1/2011 | Chang | |
| 2011/0075875 A1 | 3/2011 | Wu et al. | |
| 2011/0121413 A1 | 5/2011 | Allen et al. | |
| 2011/0186943 A1 | 8/2011 | Pahl et al. | |
| 2011/0187227 A1 | 8/2011 | Chen et al. | |
| 2011/0241197 A1 | 10/2011 | Theuss | |
| 2012/0087521 A1* | 4/2012 | Delaus | B81C 1/00238 381/174 |
| 2012/0153771 A1 | 6/2012 | Formosa et al. | |
| 2014/0037115 A1 | 2/2014 | Vos et al. | |
| 2014/0294218 A1 | 10/2014 | Suvanto et al. | |
| 2015/0251898 A1 | 9/2015 | Vos et al. | |

OTHER PUBLICATIONS

English-language machine translation of JP 2012-086345, Dainippon Printing Co Ltd (May 10, 2012).

International Search Report and Written Opinion, PCT/US2016/022598, Knowles Electronics, LLC, 8 pages (Jul. 29, 2016).

* cited by examiner

EMBEDDED CIRCUIT IN A MEMS DEVICE

CROSS REFERENCES TO RELATED APPLICATIONS

This patent is a continuation-in-part of U.S. application Ser. No. 13/755,417 entitled "Embedded Circuit in MEMS device" filed Jan. 31, 2013, which claims benefit under 35 U.S.C. §119 (e) to U.S. Provisional Application No. 61/593,611 entitled "Embedded Circuit In A MEMS Device" filed Feb. 1, 2012, the content of both of which are incorporated herein by reference in their entireties. Application Ser. No. 13/755,417 also claims benefit under 35 U.S.C. §119 (e) to U.S. Provisional Application No. 61/706,350 entitled "Embedded Circuit In A MEMS Device" filed Sep. 27, 2012, the content of which is also incorporated herein by reference in its entirety.

TECHNICAL FIELD

This application relates to acoustic devices and, more specifically, to the disposition of integrated circuits at or within these devices.

BACKGROUND OF THE INVENTION

MicroElectroMechanical System (MEMS) devices include microphones and speakers to mention two examples. In the case of a MEMS microphone, sound energy enters through a sound port and vibrates a diaphragm and this action creates a corresponding change in electrical potential (voltage) between the diaphragm and a back plate disposed near the diaphragm. This voltage represents the sound energy that has been received. Typically, the voltage is then transmitted to an electric circuit (e.g., an integrated circuit such as an application specific integrated circuit (ASIC)). Further processing of the signal may be performed on the electrical circuit. For instance, amplification or filtering functions may be performed on the voltage signal at the integrated circuit.

The components of the microphone are typically disposed on a printed circuit board (PCB), which also may provide electrical connections between the microphone components as well as providing a physical support for these components. The integrated circuit typically is of a significant size such that the overall dimensions of the MEMS device depend at least somewhat upon the size of the integrated circuit.

In many applications, the size of the MEMS device is desired to be as small as possible and the above-mentioned layout of these devices has caused problems in reducing the size of devices. For example, if the MEMS device is deployed in a cellular phone or external headset it is often desirable to have the device be as small as possible. Since the integrated circuit was always deployed on the circuit board, the overall size of the device could only be reduced so far.

Because of these shortcomings, previous approaches have not adequately addressed the above-mentioned problems and user dissatisfaction with these previous approaches has increased.

BRIEF DESCRIPTION OF THE DRAWINGS

For a more complete understanding of the disclosure, reference should be made to the following detailed description and accompanying drawings wherein.

Figure 1:
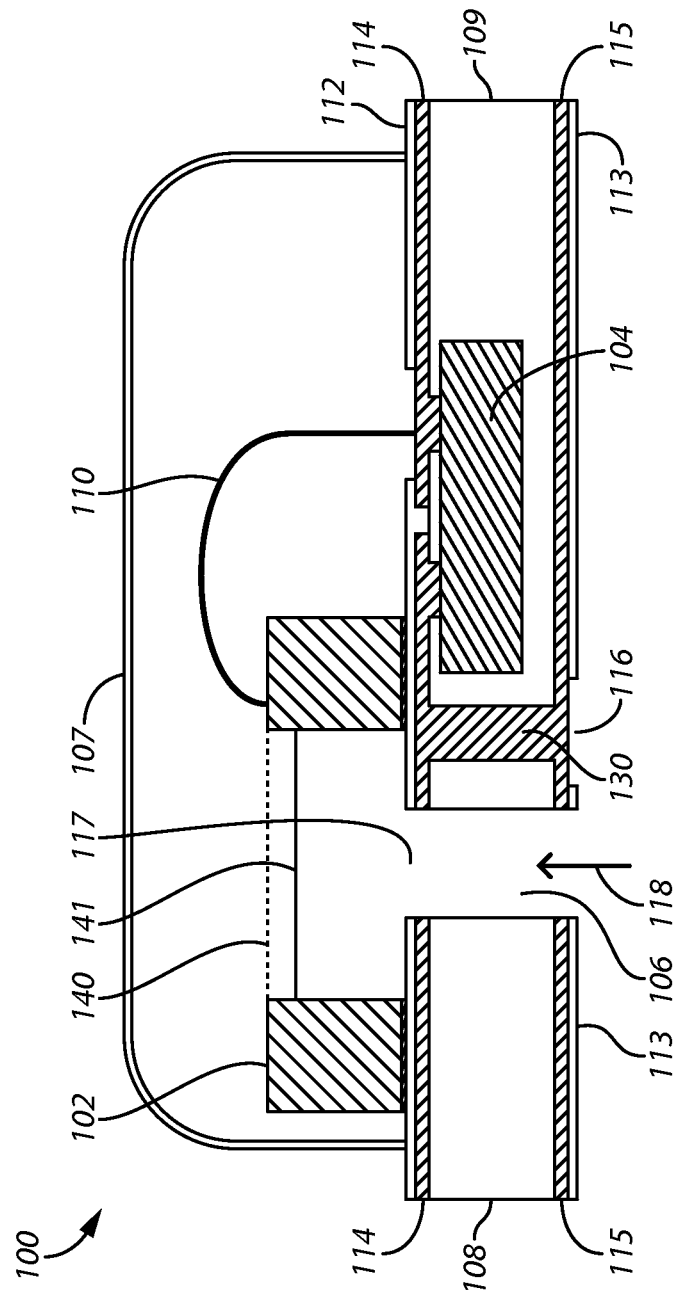
FIG. 1 is a block diagram of a MEMS device according to various embodiments of the present invention.

Skilled artisans will appreciate that elements in the figures are illustrated for simplicity and clarity. It will further be appreciated that certain actions and/or steps may be described or depicted in a particular order of occurrence while those skilled in the art will understand that such specificity with respect to sequence is not necessarily required. It will also be understood that the terms and expressions used herein have the ordinary meaning as is accorded to such terms and expressions with respect to their corresponding respective areas of inquiry and study except where specific meanings have otherwise been set forth herein.

DETAILED DESCRIPTION

Approaches are provided where an integrated circuit (e.g., an ASIC or similar device) or other electrical circuit component is embedded in the printed circuit board (PCB) of an acoustic device or assembly (e.g., a MEMS microphone). As used herein, the integrated circuit is an electronic device that may be enclosed in its own separate housing and performs separate processing functions on an incoming electrical signal where the processing functions are more than merely passing the signal. In other words, the integrated circuit is more than just a transmission medium.

In some of these embodiments, the output signals of the embedded integrated circuit (e.g., the ASIC) are routed directly into plated through hole vias in the PCB to an outer layer of metallization to customer solder pads (e.g., at the "bottom side" of the PCB). Additionally, the signals between the ASIC and MEMS die are routed directly into plated through hole vias in the PCB to the outer layer metallization opposite the customer solder pads (e.g., at the "top side" of the PCB). This outer metallization layer ("top layer") may be used for final microphone assembly. In some aspects, the MEMS die is mounted to the top side of the PCB (e.g., either by flip-chip bonding or die attach and wire bonding) and a lid is adhered (e.g., via solder, epoxy or some other approach) to the top side of the PCB to acoustically seal and protect the MEMS device (e.g., a MEMS microphone) from the environment and allow for further assembly at a customer. In other aspects, an interface layer (e.g., a redistribution layer) may be used or disposed at the integrated circuit and this interface layer may be disposed/embedded between the contact pads (of the integrated circuit) and the base (e.g., a printed circuit board).

In one advantage of the present approaches, considerable space is saved allowing the overall device to be reduced in size. The MEMS die is attached in some examples at least partially over the integrated circuit (e.g., either flip chip or wire bond with die attached) in order to save this space. In other examples, the MEMS die is disposed completely over the embedded integrated circuit (i.e., it completely covers the embedded integrated circuit). The acoustic port is disposed through the base of the PCB (i.e., through the bottom of the PCB) or through the lid (i.e., through the cover at the top of the device). An acoustic seal may be placed by the customer on the same side as the acoustic port of the acoustic device or assembly. In other aspects, a double acoustic port is used to gasket to a customer's application to increase back volume of the device and thereby improve device performance.

Since the components of the acoustic device or assembly (e.g., the MEMS die and the integrated circuit) are in some aspects physically stacked over each other, the device can be of smaller dimensions. In one example, an approximate 30 percent saving is achieved as compared to previous approaches. It will be appreciated that the integrated circuit merely occupies space that normally is unused. In so doing, a more efficient disposition of components is achieved.

In many of these embodiments, a Microelectromechanical System (MEMS) microphone includes a printed circuit board, a MEMS die, and an integrated circuit. The MEMS die is disposed on a top surface of the printed circuit board. The integrated circuit is disposed at least partially within the printed circuit board and produces at least one output signal. The output signals of the integrated circuit are routed directly into at least one conductor to access pads at the printed circuit board and the access pads are disposed on a bottom surface of the printed circuit board that is opposite the top surface.

In some aspects, at least one conductor comprises plated through hole vias and an outer layer of metallization on the printed circuit board. In other aspects, the MEMS die is mounted to the top surface of the PCB and a lid is adhered to the top surface of the PCB to acoustically seal and protect the MEMS device from external environmental elements. In some examples, a port extends through the lid and in other examples a port extends through the printed circuit board. In other aspects, a back volume is disposed between the printed circuit board and the MEMS die.

In some examples, the integrated circuit is disposed partially under the MEMS die. In other examples, the integrated circuit is disposed completely under the MEMS die.

In some aspects, the integrated circuit is an application specific integrated circuit (ASIC). In other aspects, the integrated circuit includes conductive pads and an interface layer is disposed between the conductive pads of the integrated circuit and the printed circuit board. In some aspects, the interface layer is an insulating layer.

Referring now to FIG. 1, one example of an acoustic device or assembly 100 with an embedded integrated circuit is described. The device 100 includes a printed circuit board 108, a cover or lid 107, a MEMS die 102 that includes a back plate 140 and a diaphragm 141, an integrated circuit 104, a connection area 116, and an acoustic port 106 through which sound 118 enters into a front volume 117. As the sound (indicated by the arrow labeled 118) enters the front volume 117, the diaphragm of MEMS die 102 vibrates changing the distance between the diaphragm 141 and back plate 140. This causes a voltage to be produced at the back plate 140, which is transmitted to the integrated circuit 104 via a conductor 110. The integrated circuit 104 performs processing on the signal and then the signal is transmitted to the connection area 116. A customer or other user can access the signal at the area 116 for further processing. In one example, the device or assembly 100 is deployed in a cellular phone such that the area 116 electrically couples to electronic components of the cellular phone. Other examples of customer or end-user devices (e.g., computers or headsets) are possible.

The MEMS die 102, back plate, and diaphragm are components known to those skilled in the art that are typically used on MEMS devices and will not be described further herein. The integrated circuit 104 is any circuit that performs any type of function (e.g., amplification). The integrated circuit 104 may be of any shape or configuration.

It will be appreciated that although a microphone is shown and described, other examples of MEMS devices can also be used according to the approaches described herein. It will also be appreciated that the disposition of the integrated circuit 104 is shown as being at least partially under the MEMS die 102. However, it will be appreciated that the integrated circuit 104 can be entirely under or not at all under the MEMS die 102. Additionally, although the integrated circuit 104 is shown as being rectangular it will also be understood that the integrated circuit 104 may assume any shape or appropriate dimensions. It will also be understood that multiple integrated circuits and or passive devices may be embedded into the base PCB.

The PCB 108 includes solder mask layers 112 and 113, metal layers 114 and 115, vias 130 filled or plated with a conductive metal, and an inner PCB layer 109 (e.g., constructed of woven glass epoxy composite material, such as FR-4 laminate material or BT epoxy). A wire or other conductor 110 couples the MEMS die 102 to the integrated circuit 104 via the first metal layer 114. The output of the integrated circuit 104 is electrically coupled to the area 116 via the first metal layer 114, the vias 130, and the second metal layer 115. It will be appreciated that various fabrication approaches can be used to construct the device 100 and the PCB 108. It will also be understood that other layers, configurations, dimensions, and construction materials are possible. In other aspects, an interface layer (e.g., a redistribution layer) may be used or disposed at the integrated circuit 104 and this interface layer may be disposed/embedded between the contact pads (of the integrated circuit) and the first metal layer of the PCB 108.

FIGS. 2A, 2B, 3A, 3B, and 4 are examples of acoustic devices or assemblies (e.g., MEMS microphones) that include embedded integrated circuits. As with the example of FIG. 1, it will be appreciated that although a microphone is shown, other examples of MEMS devices can also be used according to the approaches described herein. It will also be appreciated that the disposition of the integrated circuit is shown as being at least partially under the MEMS die. However, it will be appreciated that the integrated circuit can be entirely under or not at all under the MEMS die. Although the integrated circuit is shown as being rectangular it will also be understood that the integrated circuit may assume any shape or appropriate dimensions.

Figure 2A:
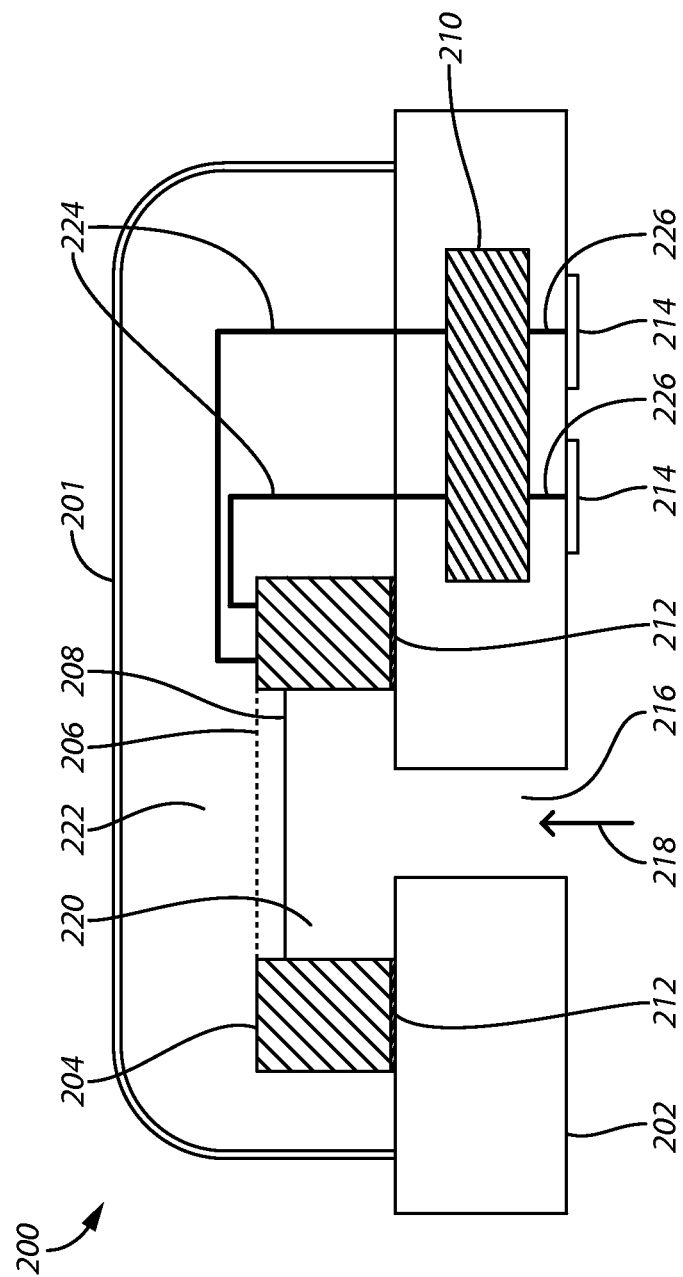
FIGS. 2A and 2B are block diagrams of MEMS devices with the MEMS die within these devices arranged in a first orientation according to various embodiments of the present invention.

Referring now to FIG. 2A, one example of an acoustic device or assembly 200 (e.g., a MEMS microphone) with an embedded integrated circuit is described. The device 200 includes a printed circuit board 202, a cover 201, a MEMS die 204 (that includes a back plate 206 and a diaphragm 208), an integrated circuit 210, acoustic seal 212, connection pads 214, and an acoustic port 216 through which sound 218 enters into a front volume 220. A back volume 222 is also provided. As the sound (indicated by the arrow labeled 218) enters the front volume 220, the diaphragm 208 vibrates changing the distance between the diaphragm 208 and back plate 206. This causes a voltage to be produced at the back plate 206, which is transmitted to the integrated circuit 210 via conductors 224. The integrated circuit 210 performs processing on the signal and transmits it to pads 214 via conductors 226. The pads 214 may be a conductive area where the electronics of a customer application (e.g., a cellular phone or computer) may be coupled. A customer can access the voltage at the pads 214 for further signal transmission or usage.

The printed circuit board 202 is any type of printed circuit board that is dimensioned to hold the integrated circuit 210. For example, the PCB may have solder mask layers, and metallization layers as described above with respect to FIG. 1.

The MEMS die 204, back plate 206, and diaphragm 208 are components known to those skilled in the art that are typically used on MEMS devices and will not be described further herein. The integrated circuit 210 is any circuit that performs any type of function (e.g., amplification). The integrated circuit 210 may be of any shape or configuration. The acoustic seals 212 provide an acoustic seal between the front volume 220 and the back volume 222 as known to those skilled in the art. The conductors 224 and 226 are constructed of any type of conducting material to provide an electrical connection. In one example, the conductors 224 are wire bonds and 226 are vias that include a metal (e.g., copper) to provide for the electrical connection. In other aspects, an interface layer (e.g., a redistribution layer) may be used or disposed at the integrated circuit 210 and this interface layer may be disposed/embedded between the contact pads (of the integrated circuit) and the first metal layer of the PCB 202.

Figure 2B:
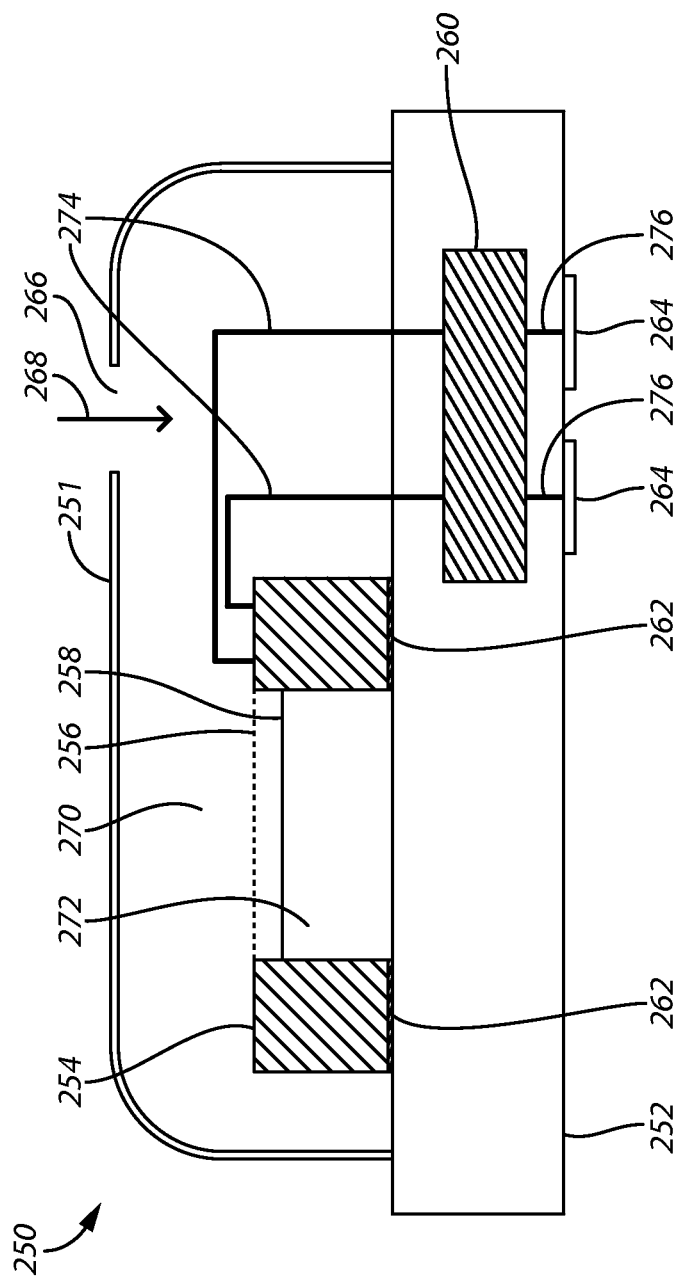

Referring now to FIG. 2B, another example of an acoustic device or assembly 250 (e.g., a MEMS microphone) within an embedded electrical circuit is described. The example of FIG. 2B is similar to the example of FIG. 2A except that the bottom port of FIG. 2A is now replaced with a top port and sound enters through the top of the device 250.

More specifically, the device 250 includes a printed circuit board 252, a cover 251, a MEMS die 254 (that includes a back plate 256 and a diaphragm 258), an integrated circuit 260, acoustic seal 262, connection pads 264, and a top acoustic port 266 through which sound 268 enters into a front volume 270. A back volume 272 is also provided. As the sound 268 enters the front volume 270, the diaphragm 258 vibrates changing the distance between the diaphragm 258 and back plate 256. This causes a voltage to be produced at the back plate 256, which is transmitted to the integrated circuit 260 via conductors 274. The integrated circuit 260 performs processing on the signal and transmits it to pads 264 via conductors 276. A customer or user can access the voltage at the pads 264 for further processing. The components operate in a manner similar to those of FIG. 2A and their operation will not be described further. The disposition of the integrated circuit within the PCB 252 is also similar to that described above with respect to FIG. 2A and this will not be described further. In other aspects, an interface layer (e.g., a redistribution layer) may be used or disposed at the integrated circuit 210 and this interface layer may be disposed/embedded between the contact pads (of the integrated circuit) and the first metal layer of the PCB 252.

Figure 3A:
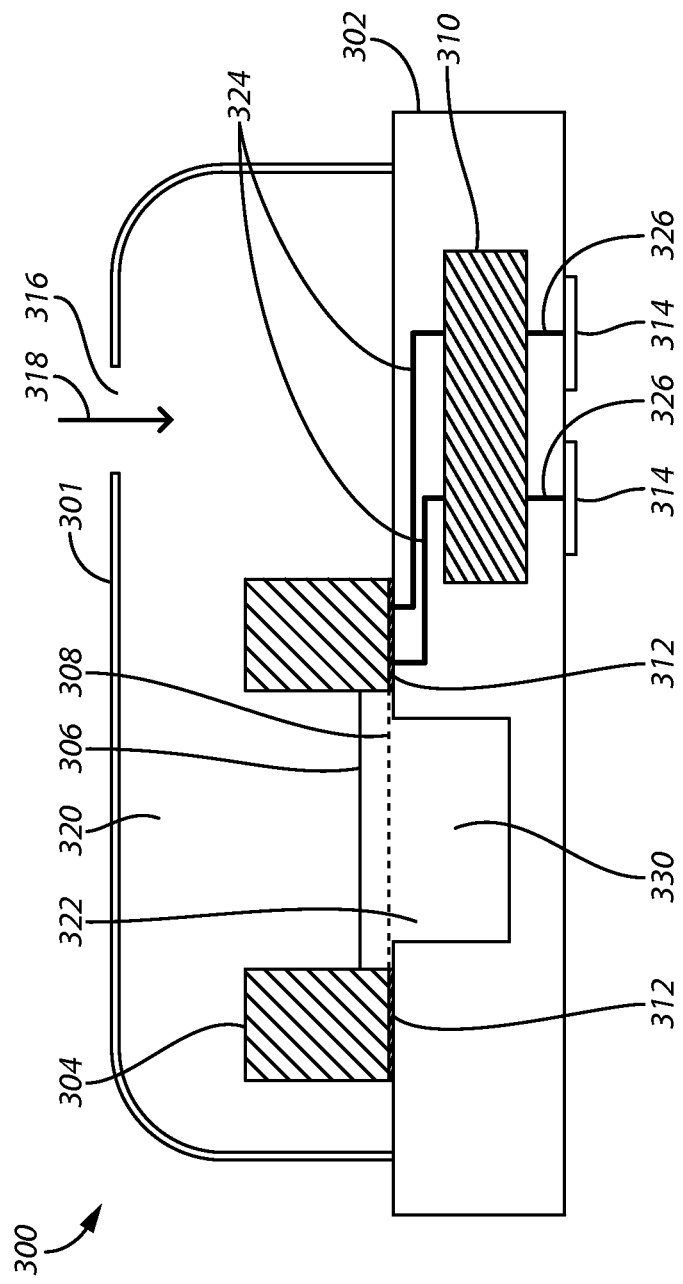
FIGS. 3A and 3B are block diagrams of MEMS devices with the MEMS die within these devices arranged in a second orientation according to various embodiments of the present invention.

Referring now to FIG. 3A, one example of an acoustic device or assembly 300 (e.g., a MEMS microphone) with an embedded integrated circuit is described. The device or assembly 300 includes a printed circuit board 302, a cover 301, a MEMS die 304 that includes a back plate 308 and a diaphragm 306, an integrated circuit 310, acoustic seal 312, connection pads 314, and a top acoustic port 316 through which sound 318 enters into a front volume 320. A back volume 322 extends between the MEMS die 304 and the PCB 302. A cavity 330 extends through the PCB 302. In some aspects, a customer application board with another cavity may couple to the PCB 302 to provide a further increased back volume. The increased back volume provides improved performance for the device 300. It will be appreciated that the dimensions, shapes, and other configuration characteristics for the cavities that comprise the increased back volume may vary to suit the performance needs of the system.

As the sound 318 enters the front volume 320, the diaphragm 306 vibrates changing the distance between the diaphragm 306 and back plate 308. This causes a voltage to be produced at the back plate 308, which is transmitted to the integrated circuit 310 via conductors 324. The integrated circuit 310 performs processing on the signal and transmits it to pads 314 via conductors 326. The pads 314 may be conductive areas to which a customer or user may couple application specific electronics (e.g., from a cellular phone or computer). A customer or user can access the voltage at the pads 314 for further processing.

The printed circuit board 302 is any type of printed circuit board that is dimensioned to hold the integrated circuit 310. One example of a PCB is described above with respect to FIG. 1.

The MEMS die 304, back plate 308, and diaphragm 306 are components known to those skilled in the art that are typically used on MEMS devices and will not be described further herein. The integrated circuit 310 is any circuit that performs any type of function (e.g., amplification). The integrated circuit 310 may be of any shape or configuration. The acoustic seal 312 provide an acoustic seal between the front volume 320 and the back volume 322 as known to those skilled in the art. The conductors 324 and 326 are constructed of any type of conducting material to provide an electrical connection. In one example, the conductors 324 and 326 are vias that include a metal (e.g., copper) to provide for the electrical connection. In other aspects, an interface layer (e.g., a redistribution layer) may be used or disposed at the integrated circuit 310 and this interface layer may be disposed/embedded between the contact pads (of the integrated circuit) and the first metal layer of the PCB 302.

Figure 3B:
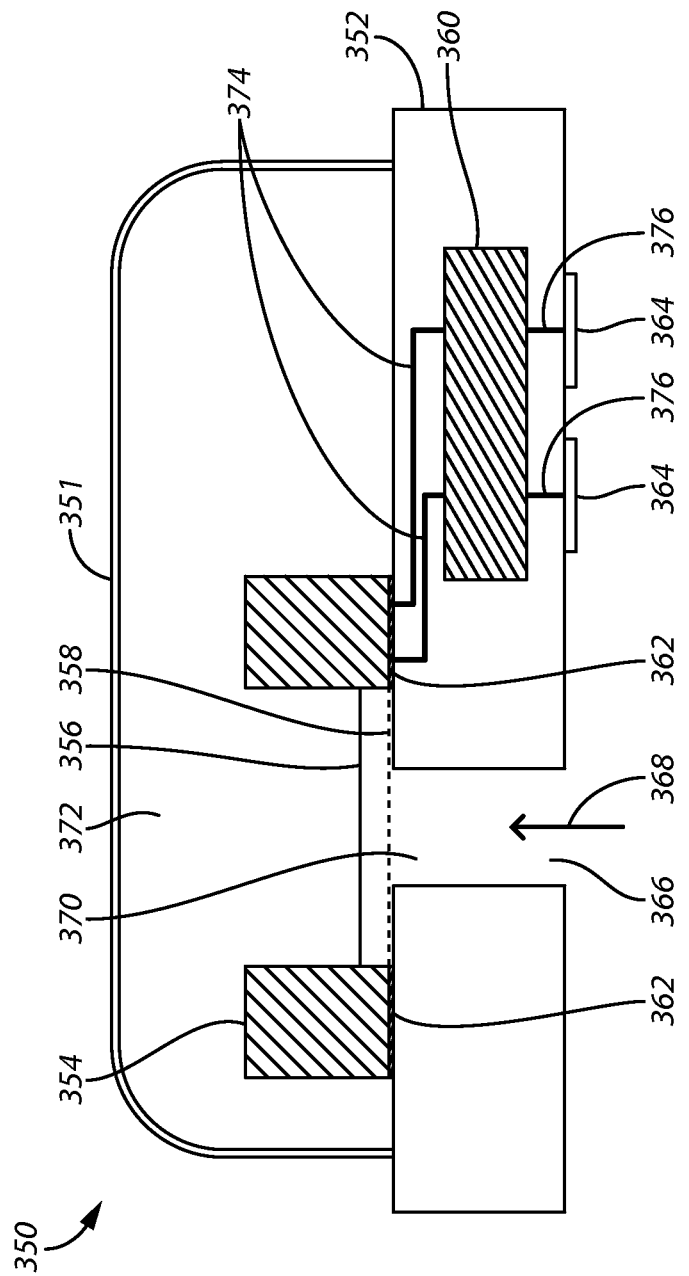

Referring now to FIG. 3B, another example of an acoustic device or assembly 350 (e.g., a MEMS microphone) within an embedded electrical circuit is described. The example of FIG. 3B is similar to the example of FIG. 3A except that the top port of FIG. 3A is now replaced with a bottom port and sound enters through the bottom of the device.

More specifically, the device 350 includes a printed circuit board 352, a cover 351, a MEMS die 354 that includes a back plate 358 and a diaphragm 356, an integrated circuit 360, acoustic seal 362, connection pads 364, and a bottom acoustic port 366 through which sound 368 enters into a front volume 370. A back volume 372 is also provided. As the sound 368 enters the front volume 370, the diaphragm 356 vibrates changing the distance between the diaphragm 356 and back plate 358. This causes a voltage to be produced at the back plate 358, which is transmitted to the integrated circuit 360 via conductors. The integrated circuit 360 performs processing on the signal and transmits it to pads 364 via conductors 376. A customer can access the voltage at the pads 364 for further processing. The components of the system of FIG. 3B operate in a manner similar to those of FIG. 3A and their operation will not be described further herein. In other aspects, an interface layer (e.g., a redistribution layer) may be used or disposed at the integrated circuit 310 and this interface layer may be disposed/embedded between the contact pads (of the integrated circuit) and the first metal layer of the PCB 352.

In other aspects, the integrated circuits used herein can take a variety of different forms and structures. For example, in one aspect the integrated circuit (e.g., an ASIC) has active electrical circuitry (e.g., resistors or capacitors) and/or electrical connections on only one side. This disposition makes the integrated circuit less expensive than integrated circuits that have active circuitry and/or electrical connections on both sides. In other aspects, the base PCB may also have embedded chip capacitors or resistors to improve acoustical or electrical (e.g., RF immunity) performance.

In other aspects, the integrated circuit has no open holes or openings in or through it. Having no holes extending through the integrated circuit is advantageous because silicon is typically expensive and, in many circumstances, it is preferable that any acoustic holes (e.g., ports) be made through the printed circuit board (PCB) only and not through the integrated circuit.

Figure 4:
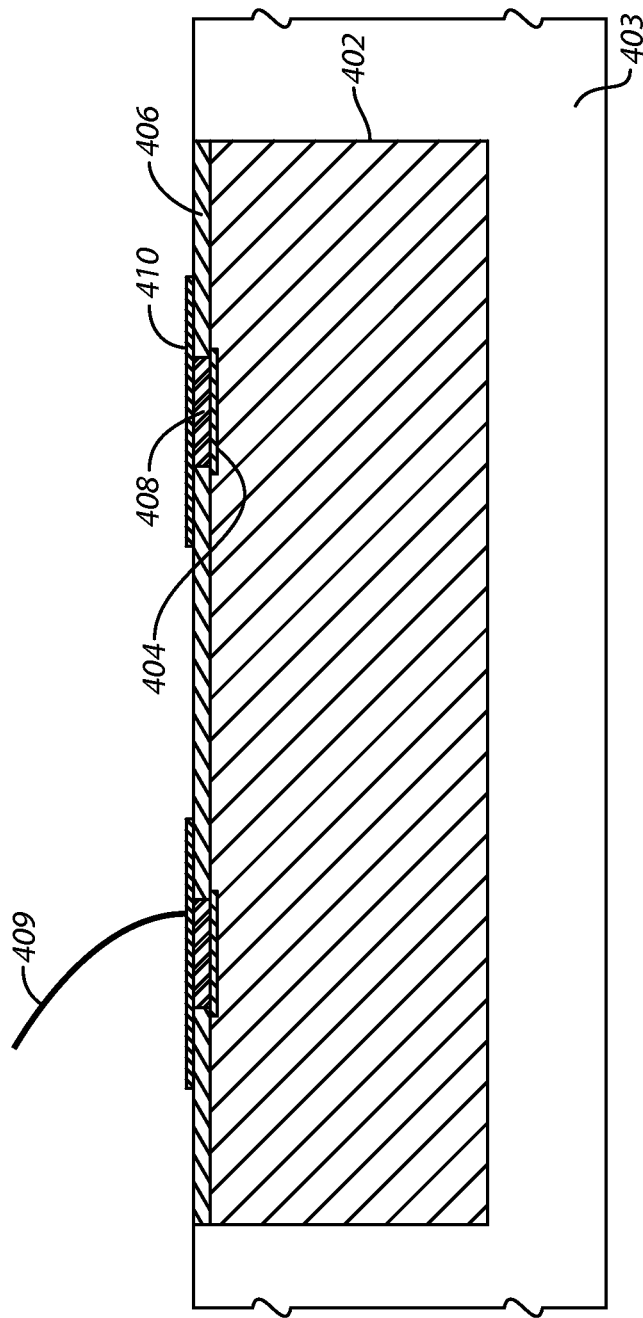
FIG. 4 is a cross sectional diagram of a portion of a MEMS device or assembly showing a close-up view of an embedded integrated circuit according to various embodiments of the present invention.

In the example acoustic assemblies described herein, an interface layer (e.g., a redistribution layer) may be used or disposed at the integrated circuit and this interface layer may be disposed/embedded between the contact pads (of the integrated circuit) and the base (e.g., a printed circuit board). Referring now to FIG. 4, one example of such an arrangement is described. It will be understood that this arrangement—shown in detail in FIG. 4—can be applied to any of the other examples presented herein. An integrated circuit 402 includes conductive pads 404 and is disposed in a base (e.g., a PCB) 403. The pads 404 are in one aspect metal pads and may be constructed of aluminum. Other examples of conductive materials may also be used. An insulating layer 406 (a part of the integrated circuit 402) is disposed over and across the integrated circuit 402. Electrically conductive vias 408 extend through the insulating layer 406. Conductive redistribution pads 410 (e.g., constructed from copper) are disposed on the insulating layer 406 and are coupled to the vias 408. A laser drilled via (not shown in FIG. 4) that is plated with copper couples the first layer of the PCB to the RDL pad.

In one particular example, the integrated circuit 402 is an ASIC that includes the RDL-Cu pads 410 and aluminum pads 404. The insulating layer 406 provides an interface from pads 404 on the ASIC 402 to the base 403 (e.g., a PCB) in which the ASIC 402 is embedded. The insulating layer 406 has openings to the aluminum pads 404. In one aspect, the copper pads 410 are larger (e.g., having a large surface area or cross-sectional area) than the aluminum pads 404.

The aluminum pads 404 and copper RDL pads 410 are connected by using the vias/holes 408 through the insulating layer 406.

The RDL pads 410 on top of the ASIC 402 provide an advantageous interface between the integrated circuit 402 and the base 403 (e.g., a PCB). In this respect, PCB processing generally uses copper plating. Good adhesion and/or a good interface/bond occur when, for example, the PCB copper via is directly contacted to another copper layer (i.e., copper RDL pad 410). In other words, after the ASIC is embedded into the PCB material, a hole is laser drilled such that an opening is produced to the copper pad on the RDL layer. The PCB board with the embedded ASIC and laser drilled holes is then placed in a copper plating bath so as to plate the walls of the laser drilled hole. This provides a physically secure and electrically sufficient bond between the electrically circuitry of the PCB, the copper RDL pads and the bond pads on the ASIC.

In other aspects, the integrated circuit 402 is completely laminated into the base/PCB with no intentional air voids around the integrated circuit 402. By "laminating," it is meant that materials (such as epoxy laminate, copper and adhesive) are layered and placed in a press using temperature, pressure and potentially in a vacuum environment. This gives the package better mechanical stability and likely better reliability performance than a package that has space/voids around the integrated circuit 402.

Figure 5:
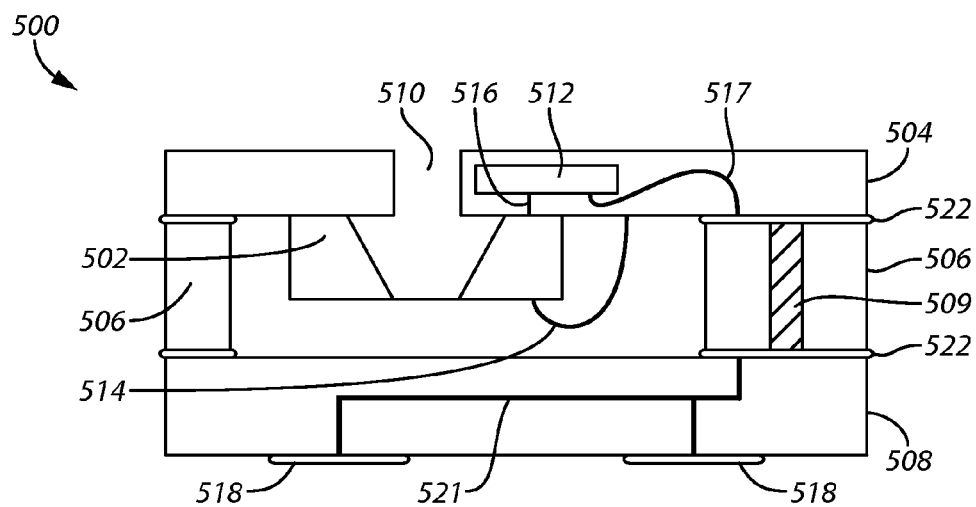
FIG. 5 comprises a cross sectional diagram of a portion of a MEMS device or assembly according to various embodiments of the present invention.

Referring now to FIG. 5, a MEMS microphone 500 includes a MEMS device 502, a lid 504, walls 506, plated through-hole via 509, a base printed circuit board 508. An acoustic port 510 extends through lid 504. The lid 504 in this example is a printed circuit board. An integrated circuit 512 (e.g., an application specific integrated circuit (ASIC)) is embedded in the lid 504. By "embedded," it is meant that the integrated circuit 512 is completely surrounded by the lid 504. Wire bonds 514 connect the MEMS device 502 to the lid 504 (which in one aspect is a printed circuit board including conductive and non-conductive layers). Inner wiring connections 516 couple the wire bonds 514 to the integrated circuit 512. Metal traces 517 couple the integrated circuit 512 to the plated through-hole via 509. The plated through-hole via 509 couples to customer solder pads 518 via connections in base 508, which in one aspect is a printed circuit board. The through-hole via 509 in one example is a hollow or filled cylindrical opening plated with an electrically conductive metal that allows signals to be transmitted.

The MEMS device 502 includes a diaphragm and a back plate. Sound energy moves the diaphragm and this creates an electrical signal. The electrical signal is transmitted to the integrated circuit 512 via wire bonds 514 and connections 516. From the integrated circuit 512, the signal is transmitted to the plated through-holes 509 via wiring metal traces 517. The through-hole via 509 transmits the signals over connections 521 in the base 508 and to customer solder pads 518, where consumer electronic devices may be coupled. Solder 522 couples the walls 506 to the base 508 and lid 504. As shown, the pads 518 are connected to receive the same electrical signal, but the pads generally receive separate signals. The configuration of FIG. 5 is a MEMS-on-lid configuration in which the electrical signals created by the MEMS device 502 are sent to an embedded ASIC in the lid 504 and hence to customer solder pads 518 via the through hole via 509 and electrical connections in the base 508.

Figure 6:
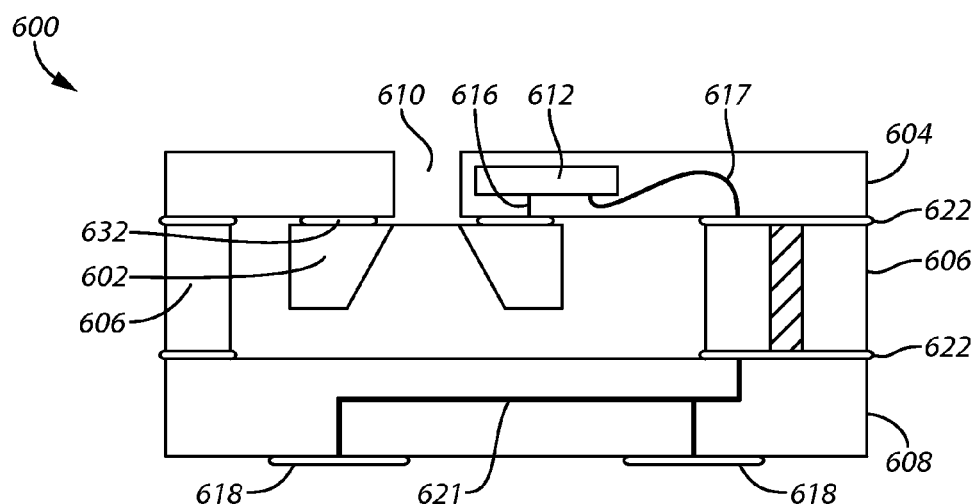
FIG. 6 comprises a cross sectional diagram of a portion of a MEMS device or assembly according to various embodiments of the present invention.

Referring now to FIG. 6, another example of a microphone 600 is described. The microphone 600 is similar to the microphone 500 of FIG. 5 except that the MEMS device 602 is flipped (relative to the position of the MEMS device 502 in FIG. 5) so as to be bonded directly to lid PCB 604 via solder 632 (without the use of lead wires). Like-numbered elements in FIG. 5 correspond to like-numbered elements in FIG. 6 and these descriptions will not be repeated here. In operation, the electrical path of signals from the MEMS device 602 to customer pads 618 is the same as in the device in FIG. 5 except that the wire bonds are omitted in FIG. 6.

Figure 7:
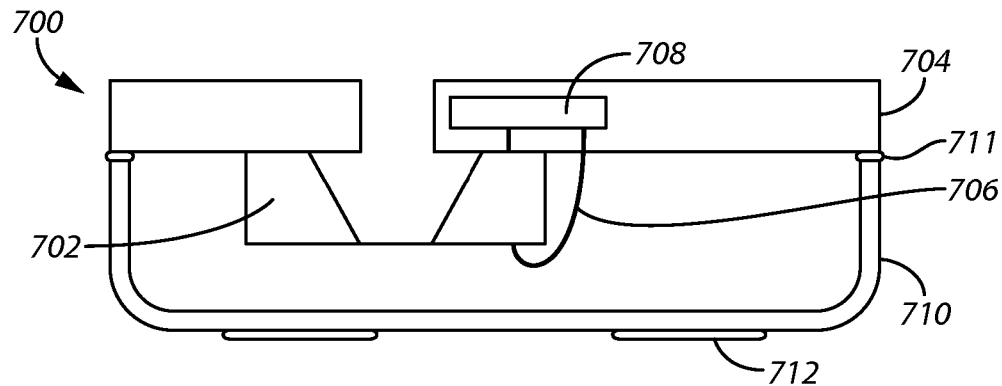
FIG. 7 comprises a cross sectional diagram of a portion of a MEMS device or assembly according to various embodiments of the present invention.

Referring now to FIG. 7, one example of a microphone 700 is described. A MEMS device 702 couples to a lid 704. Wire bonds 706 couple the MEMS device 702 to an integrated circuit (e.g., ASIC) 708. The integrated circuit 708 is embedded in the lid 704. By "embedded," it is meant that the integrated circuit 708 is completely surrounded by the lid 704. A molded cup 710 (e.g., constructed of plastic or some other suitable material) encloses the MEMS device 702. The cup 710 couples to the lid 704 with solder and/or epoxy 711 to mention two examples. Customer solder pads 712 and electrical signals on the surface of the cup couple to the lid 704. The configuration of FIG. 7 is a MEMS-on-lid configuration in which the electrical signals created by the MEMS device 702 are sent to an embedded ASIC in the lid 704 and hence to customer solder pads 712 via the cup 710.

In operation, sound is sensed by the MEMS device 702 and converted to an electrical signal that is processed by ASIC 708 and sent by electrical traces on the surface of the cup to pads 712.

Figure 8:
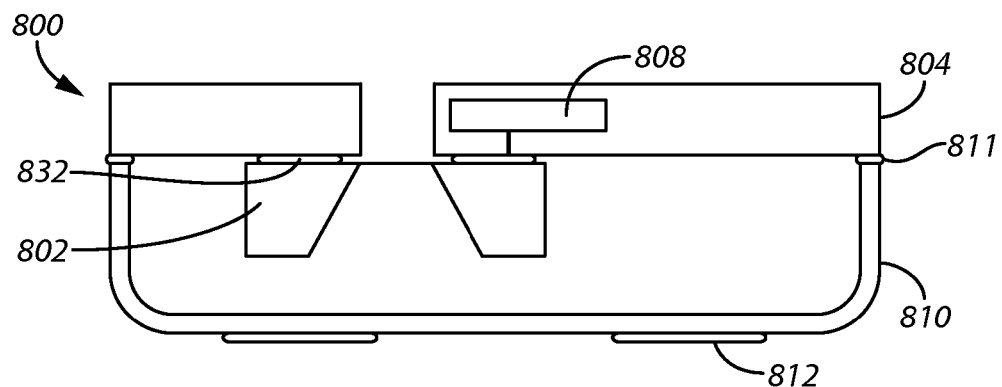
FIG. 8 comprises a cross sectional diagram of a portion of a MEMS device or assembly according to various embodiments of the present invention.

Referring now to FIG. 8, another example of a microphone 800 is described. The microphone 800 is similar to the microphone 700 of FIG. 7 except that the MEMS device 802 is flipped so as to directly bond to lid PCB 704 via solder or gold 832 (without the use of lead wires). Like-numbered elements in FIG. 7 correspond to like-numbered elements in FIG. 8 and these descriptions will not be repeated here.

In operation, the electrical path of signals from the MEMS device 802 to customer pads 812 is the same as the device in FIG. 7 except that the wire bonds are omitted in FIG. 8.

Figure 9:
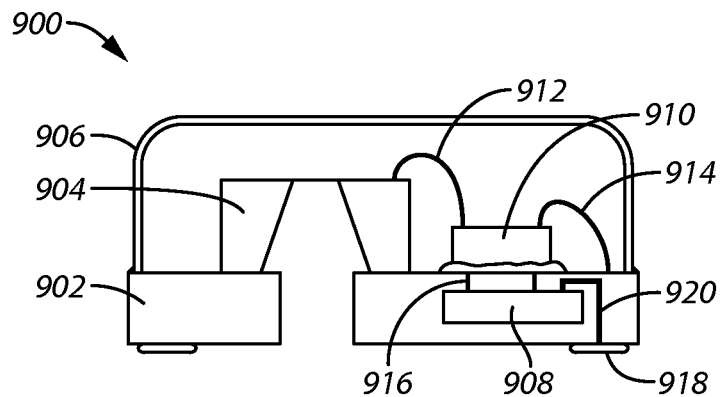
FIG. 9 comprises a cross sectional diagram of a portion of a MEMS device or assembly according to various embodiments of the present invention.

Referring now to FIG. 9, one example of a microphone 900 is described. The microphone 900 includes a base 902 (e.g., printed circuit board), a MEMS device 904 (including a diaphragm and a back plate), and a metal can 906. A first integrated circuit (e.g., ASIC 908) is embedded in the base 902. By "embedded," it is meant that the integrated circuit 908 is completely surrounded by the base 902. A second integrated circuit (e.g., ASIC 910) is disposed on the base 902, but not embedded in the base 902.

Wire bond 912 couples the MEMS device 904 directly to the second integrated circuit 910. The second integrated circuit 910 is coupled to the first integrated circuit 908 via solder 914 and electrical paths 916. The first integrated circuit 910 couples to pads 918 via electrical paths 920. In one example, the first (embedded) integrated circuit 908 may perform processing functions such as amplification, analog to digital conversion, sensitivity trimming, digital signal processing while the second (non-embedded) integrated circuit 910 may perform processing functions such as amplification, analog to digital conversion, sensitivity trimming, digital signal processing, temperature sensing, and chemical sensing. Other examples are possible.

Figure 10:
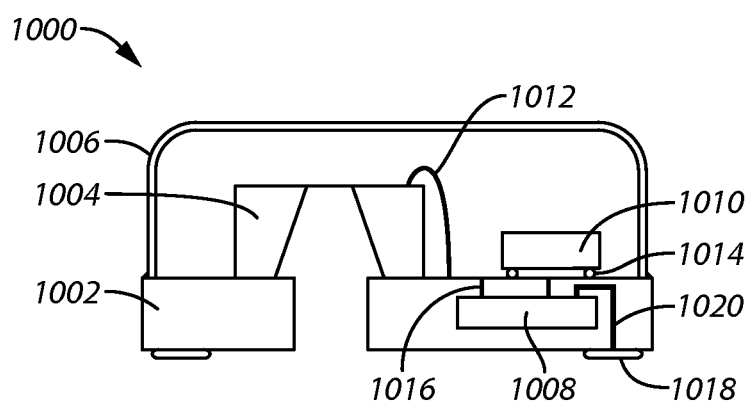
FIG. 10 comprises a cross sectional diagram of a portion of a MEMS device or assembly according to various embodiments of the present invention.
Figure 11:
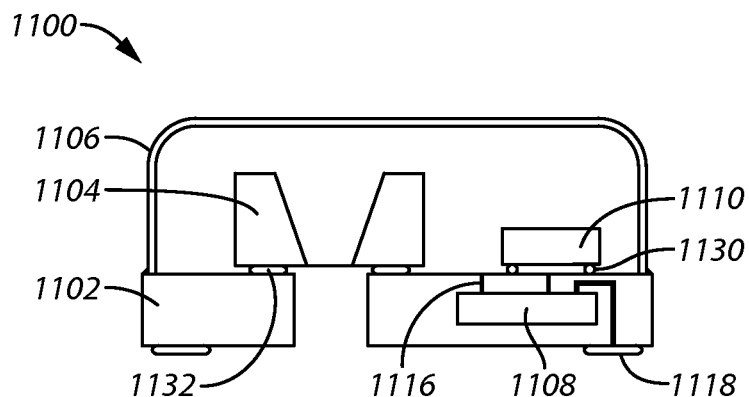
FIG. 11 comprises a cross sectional diagram of a portion of a MEMS device or assembly according to various embodiments of the present invention.

It will be appreciated that in the examples of FIG. 9, FIG. 10, and FIG. 11 the first (embedded) integrated circuit may alternatively couple to the customer pads as has been described elsewhere in this description. For example, the base 902 may be a printed circuit board, and the printed circuit board has a first metal layer, a second metal layer, and at least one plated through hole via that extends through the base 902. The first metal layer and the second metal layer electrically couple to opposing end portions of the at least one plated through hole via. The integrated circuit may have a surface facing the first metal layer. The first integrated circuit 908 is disposed within the printed circuit board and between the first metal layer and the second metal layer. The at least one output signal of the first integrated circuit 908 is routed directly from the top surface of the first integrated circuit 908 to the first metal layer of the printed circuit board, to the at least one second plated through hole via, to the second metal layer, and then to the customer (access) pads 918 at the printed circuit board.

Referring now to FIG. 10, another example of a microphone 1000 is described. The microphone 1000 includes a base 1002 (e.g., printed circuit board), a MEM device 1004 (including a diaphragm and a back plate), and a metal can 1006. A first integrated circuit (e.g., ASIC) 1008 is embedded in the base 1002. A second integrated circuit (e.g., ASIC) 1010 is disposed on the base 1002. Wire bond 912 couples the MEMS device 1004 to the base 1002 (a connector on the base). Solder 1014 couples the base 1002 to the first ASIC 1008. First integrated circuit 1008 couples to customer pads 1016 via electrical connections 1018 within the base 1002. In one example, the first (embedded) integrated circuit 1008 may perform processing functions such as amplification, analog to digital conversion, sensitivity trimming, digital signal processing while the second (non-embedded) integrated circuit 1010 may perform processing functions such as amplification, analog to digital conversion, sensitivity trimming, digital signal processing, temperature sensing, and chemical sensing. Other examples are possible.

Referring now to FIG. 11, one example of a microphone 1100 is described. The microphone 1100 includes a base 1102 (e.g., printed circuit board), a MEM device 1104 (including a diaphragm and a back plate), and a metal can 1106. A first integrated circuit (e.g., ASIC) 1108 is embedded in the base 1102. A second integrated circuit (e.g., ASIC) 1110 is disposed on the base 1102.

In this example, MEMS device 1104 couples to base 1102 via solder 1132; second integrated circuit 1110 couples to base 1102; the embedded first integrated circuit 1108 couples to base 1102 via electrical paths 1112 (in the base 1102); first integrated circuit 1108 couples to customer pads 1114 via electrical paths 1116 (in the base 1102); and the second integrated circuit 1110 coupled to the base 1102 via solder 1130. In one example, the first (embedded) integrated circuit 1108 may perform processing functions such as amplification, analog to digital conversion, sensitivity trimming, digital signal processing while the second (non-embedded) integrated circuit 1110 may perform processing functions such as amplification, analog to digital conversion, sensitivity trimming, digital signal processing, temperature sensing, and chemical sensing. Other examples are possible.

Preferred embodiments of this invention are described herein, including the best mode known to the inventors for carrying out the invention. It should be understood that the illustrated embodiments are exemplary only, and should not be taken as limiting the scope of the invention.

What is claimed is:

1. A microelectromechanical system (MEMS) microphone, comprising,
    a base printed circuit board (PCB), the base PCB having customer pads;
    at least one wall coupled to the base;
    a lid PCB coupled to the at least one wall, the lid having a port extending there through;
    an electrically conductive through-hole via extending through the wall electrically connecting the lid PCB to the base PCB;

an integrated circuit embedded in the lid and coupled to the electrically conductive through-hole via, wherein the integrated circuit is coupled to the electrically conductive through-hole via with an electrical trace that is embedded in the lid;

a MEMS device coupled to the integrated circuit in the lid and disposed over the port such that sound energy is converted to an electrical signal by the MEMS device and transmitted to the integrated circuit, the integrated circuit processing the signals and sending the processed signals to the customer pads via the electrically conductive through-hole via;

such that the electrically conductive through-hole via forms an electrical path for passing the processed signals.

2. The MEMS microphone of claim 1, wherein the MEMS device couples to the base via a lead wire.

3. The MEMS microphone of claim 1, wherein the MEMS device couples to the base via a solder connection, and wherein the MEMS device does not couple to the base via a lead wire.

4. A microelectromechanical system microphone, comprising, a base printed circuit board (PCB), the base PCB having customer pads;

a first integrated circuit embedded in the base;

a second integrated circuit not embedded in the base but disposed on the base and electrically coupled to the first integrated circuit;

a MEMS device coupled to one or both of the first integrated circuit and the second integrated circuit;

such that sound energy is converted to an electrical signal by the MEMS device and transmitted to one or both of the first integrated circuit and the second integrated circuit for processing, the processed signal being made available at the customer pads on the base;

wherein the base includes a first surface facing the cavity and a second surface facing the exterior, wherein the base includes a first metal layer and a second metal layer and includes a through hole via extending through the base, wherein the first metal layer and the second metal layer couple to opposing ends of the via, wherein the first integrated circuit is disposed between the first metal layer and the second metal layer and wherein the second metal layer is coupled to customer pads, wherein the second integrated circuit couples to the first metal layer;

such that an electrical path is formed from the first integrated circuit to the first metal layer, through the via, to the second metal layer, and then to the customer pad.

5. The MEMS microphone of claim 4, wherein the first integrated circuit comprises an application specific integrated circuit.

6. The MEMS microphone of claim 4, wherein the MEMS device couples to the base via a lead wire.

7. The MEMS microphone of claim 4, wherein the MEMS device couples to the base via a solder connection.

8. The MEMS microphone of claim 1, wherein the electrically conductive through-hole via is plated with an electrically conductive metal.

9. The MEMS microphone of claim 1, wherein the electrically conductive through-hole via is hollow.

10. The MEMS microphone of claim 1, wherein the electrically conductive through-hole via is filled.

11. The MEMS microphone of claim 4, wherein the first integrated circuit performs amplification.

12. The MEMS microphone of claim 4, wherein the first integrated circuit performs analog to digital conversion.

13. The MEMS microphone of claim 4, wherein the first integrated circuit performs sensitivity trimming.

14. The MEMS microphone of claim 4, wherein the first integrated circuit performs digital signal processing.

15. The MEMS microphone of claim 4, wherein the second integrated circuit performs amplification.

16. The MEMS microphone of claim 4, wherein the second integrated circuit performs analog to digital conversion.

17. The MEMS microphone of claim 4, wherein the second integrated circuit performs sensitivity trimming.

18. The MEMS microphone of claim 4, wherein the second integrated circuit performs digital signal processing.

19. The MEMS microphone of claim 1, wherein the electrical trace is not within a back volume of the MEMS microphone.

20. The MEMS microphone of claim 19, wherein the integrated circuit is not coupled to the electrically conductive through-hole via with a lead wire.

* * * * *